United States Patent
Liu et al.

(10) Patent No.: US 10,115,810 B2
(45) Date of Patent: Oct. 30, 2018

(54) HETEROJUNCTION BIPOLAR TRANSISTOR WITH A THICKENED EXTRINSIC BASE

(71) Applicant: GLOBALFOUNDRIES Inc., Grand Cayman (KY)

(72) Inventors: Qizhi Liu, Lexington, MA (US); Vibhor Jain, Essex Junction, VT (US); John J. Pekarik, Underhill, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 35 days.

(21) Appl. No.: 15/437,168

(22) Filed: Feb. 20, 2017

(65) Prior Publication Data

US 2018/0240897 A1 Aug. 23, 2018

(51) Int. Cl.
*H01L 21/331* (2006.01)
*H01L 29/66* (2006.01)
*H01L 29/737* (2006.01)
*H01L 29/165* (2006.01)

(52) U.S. Cl.
CPC ........ *H01L 29/7375* (2013.01); *H01L 29/165* (2013.01); *H01L 29/66242* (2013.01)

(58) Field of Classification Search
CPC .................................................. H01L 29/7375
USPC ......... 257/591, 592; 438/312, 341, 343, 350
See application file for complete search history.

(56) References Cited

U.S. PATENT DOCUMENTS

| | | | | |
|---|---|---|---|---|
| 6,521,504 B1 * | 2/2003 | Kohno-Hiroshi | ..... | H01L 21/331 438/341 |
| 8,624,104 B2 * | 1/2014 | Bedell | ............... | H01L 31/03046 136/255 |
| 8,932,978 B2 * | 1/2015 | Ling et al. | ........ | H01L 31/03529 136/255 |
| 9,059,234 B2 * | 6/2015 | Benoit | ................ | H01L 29/7378 438/739 |
| 9,093,491 B2 | 7/2015 | Adkisson et al. | | |
| 9,231,087 B2 | 1/2016 | Benoit et al. | | |

* cited by examiner

*Primary Examiner* — Calvin Lee
(74) *Attorney, Agent, or Firm* — Thompson Hine LLP; Anthony Canale

(57) ABSTRACT

Device structures and fabrication methods for a heterojunction bipolar transistor. A collector of the device structure has a top surface and a sidewall that is inclined relative to the top surface. The device structure further includes an emitter, an intrinsic base that has a first thickness, and an extrinsic base coupled with the intrinsic base. The extrinsic base has a lateral arrangement relative to the intrinsic base and relative to the emitter. The intrinsic base has a vertical arrangement between the emitter and the top surface of the collector. The sidewall of the collector extends laterally to undercut the extrinsic base. The extrinsic base has a second thickness that is greater than a first thickness of the intrinsic base.

11 Claims, 6 Drawing Sheets

HETEROJUNCTION BIPOLAR TRANSISTOR WITH A THICKENED EXTRINSIC BASE

BACKGROUND

The invention relates generally to semiconductor device and integrated circuit fabrication and, in particular, to device structures and fabrication methods for a heterojunction bipolar transistor.

A bipolar junction transistor is a three-terminal electronic device that includes an emitter, a collector, and an intrinsic base arranged between the emitter and collector. In a PNP bipolar junction transistor, the emitter and collector are composed of p-type semiconductor material, and the intrinsic base is composed of n-type semiconductor material. In an NPN bipolar junction transistor, the emitter and collector are composed of n-type semiconductor material, and the intrinsic base is composed of p-type semiconductor material. When powered during operation, the base-emitter junction is forward biased, the base-collector junction is reverse biased, and the collector-emitter current may be controlled by a base-emitter voltage.

A heterojunction bipolar transistor is a variant of a bipolar junction transistor in which at least two of the collector, emitter, and intrinsic base in the device structure are constituted by semiconductor materials with different energy bandgaps, which creates heterojunctions. For example, the collector and/or emitter of a heterojunction bipolar transistor may be constituted by silicon, and the base of a heterojunction bipolar transistor may be constituted by silicon germanium (SiGe), which is characterized by a narrower band gap than silicon.

Improved device structures and fabrication methods for a heterojunction bipolar transistor are needed.

SUMMARY

In an embodiment of the invention, a structure is provided for a heterojunction bipolar transistor. The structure includes a collector having a top surface and a sidewall that is inclined relative to the top surface, an emitter, an intrinsic base that has a first thickness, and an extrinsic base coupled with the intrinsic base. The extrinsic base has a lateral arrangement relative to the intrinsic base and relative to the emitter. The intrinsic base has a vertical arrangement between the emitter and the top surface of the collector. The sidewall of the collector extends laterally to undercut the extrinsic base. The extrinsic base has a second thickness that is greater than a first thickness of the intrinsic base.

In an embodiment of the invention, a method is provided for forming a heterojunction bipolar transistor. The method includes epitaxially growing a first semiconductor layer on a top surface of a substrate, epitaxially growing a second semiconductor layer on the first semiconductor layer, amorphizing a first section of the second semiconductor layer, and doping a second section of the second semiconductor layer that has a lateral arrangement relative to the first section of the second semiconductor layer. The method further includes etching the second semiconductor layer beneath the first section and selective to the first section and the second section of the second semiconductor layer to form an emitter beneath the first section and a cavity that laterally separates the second section from the emitter.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
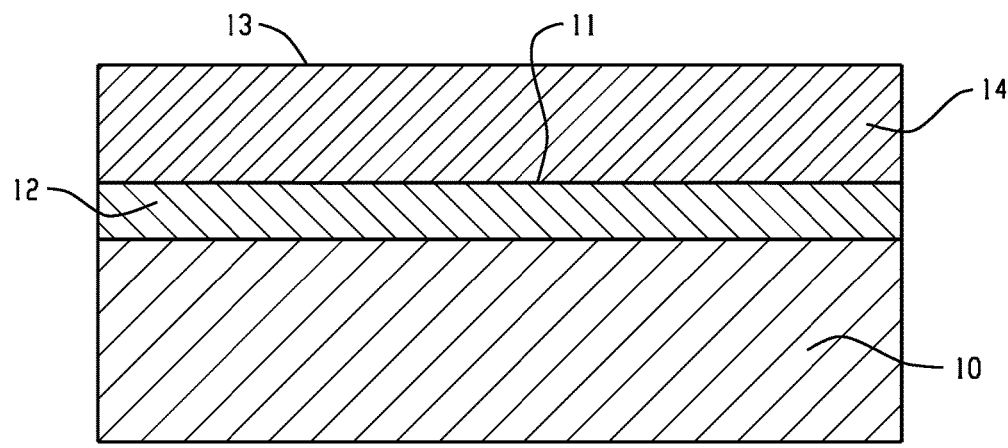
FIGS. 1-9 are cross-sectional views of a portion of a substrate at successive fabrication stages of a processing method for fabricating a device structure in accordance with embodiments of the invention.

With reference to FIG. 1 and in accordance with an embodiment of the invention, a substrate 10 comprises a single-crystal semiconductor material usable to form the devices of an integrated circuit. For example, the substrate 10 may be comprised of a bulk wafer of a monocrystalline silicon-containing material, such as single-crystal silicon, or a device layer of a silicon-on-insulator wafer. The semiconductor material constituting the substrate 10 may comprise an electrically-active dopant that alters its electrical properties and may also include an optional epitaxial layer. The substrate 10 may comprise an n-type dopant from Group V of the Periodic Table (e.g., phosphorus (P) or arsenic (As)) in a concentration that is effective to impart n-type conductivity.

A base layer 12 is formed as a continuous additive film on a top surface of substrate 10. The base layer 12 may be comprised of a semiconductor material, such as silicon-germanium (SiGe) in an alloy with a content of silicon (Si) ranging from 95 atomic percent to 50 atomic percent and a content of germanium (Ge) ranging from 5 atomic percent to 50 atomic percent. The germanium content of the base layer 12 may be uniform across the thickness of base layer 12, or may be graded and/or stepped across the thickness of base layer 12. The base layer 12 may comprise a dopant, such as a p-type dopant (e.g., boron) selected from Group III of the Periodic Table in a concentration that is effective to impart p-type conductivity and, optionally, carbon (C) to suppress the outdiffusion of the p-type dopant.

An emitter layer 14 is formed as a continuous additive film on a top surface 11 of the base layer 12. The emitter layer 14 may be comprised of a different semiconductor material than base layer 12. For example, the emitter layer 14 may lack germanium that may be present in at least a portion of the base layer 12. The emitter layer 14 may be doped to have an opposite conductivity type from the base layer 12. In a representative embodiment, the emitter layer 14 may be comprised of a semiconductor material, such as silicon, and may contain an n-type dopant (e.g., arsenic (Ar) or phosphorus (P)) in a concentration effective to impart n-type conductivity. The dopant may be added during epitaxial growth or may be added by implantation after epitaxial growth.

The base layer 12 and emitter layer 14 each have an epitaxial relationship with the substrate 10 and with each other in the layer stack on the substrate. The crystal structure of the substrate 10 establishes a crystalline template for the growth of the crystal structure of the base layer 12. The crystal structure of the base layer 12 serves as a crystalline template for the growth of the crystal structure of the emitter layer 14 such that the layers 12, 14 both have a crystal structure established by the substrate 10 and may have the same or different lattice constants depending on their respective compositions. For example, the base layer 12 and emitter layer 14 may be formed using a low temperature epitaxial (LTE) growth process, such as vapor phase epitaxy (VPE) conducted at a growth temperature ranging from 400° C. to 850° C.

Figure 2:
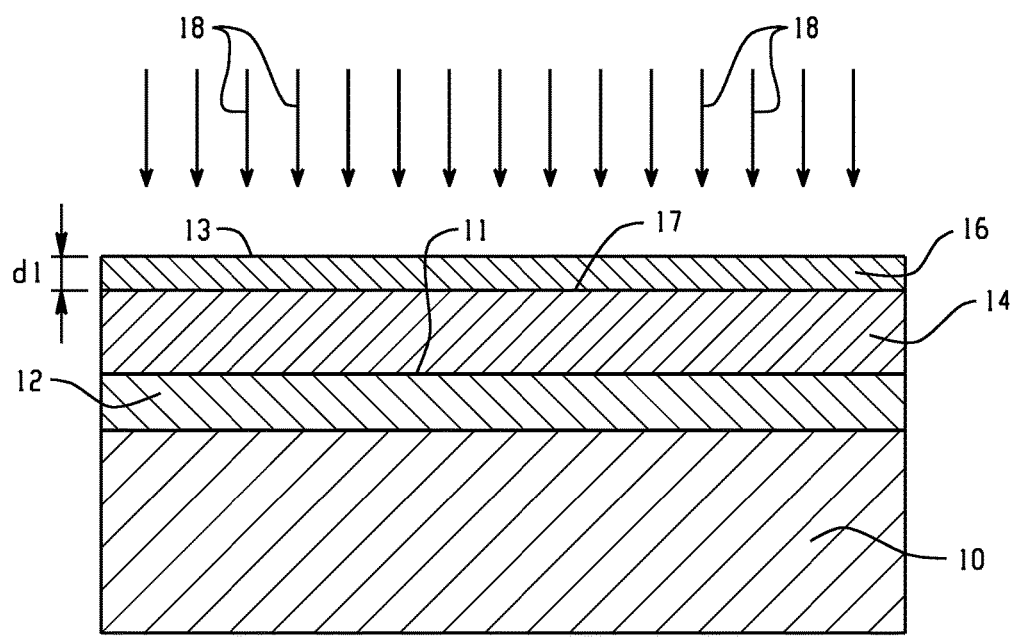

With reference to FIG. 2 in which like reference numerals refer to like features in FIG. 1 and at a subsequent fabrication stage, an amorphized layer 16 is formed in an upper section of the emitter layer 14 beneath the top surface 13 of the emitter layer 14. The amorphized layer 16 is located vertically above a lower section of the emitter layer 14 that retains its original crystal structure because it is not implanted. The amorphized layer 16 and the lower section of the emitter layer 14 meet and join along an interface 17. The lower section of the emitter layer 14 is located vertically between the base layer 12 and the amorphized layer 16.

The amorphized layer 16 may be formed by ion implantation that introduces energetic ions, as indicated diagrammatically by the single-headed arrows 18, through the top surface 13 and into the upper section of the emitter layer 14. The amorphized layer 16 is vertically arranged between the top surface of emitter layer 14 and the interface 17. The trajectories of the ions 18 penetrate into the semiconductor material of the emitter layer 14 with a depth profile parameterized by a projected range and a range straggle. The crystal structure of the emitter layer 14 is altered (i.e., amorphized) over the thickness of the amorphized layer 16 relative to its initial single-crystal state by implantation damage induced by the ions 18.

The ions 18 may be generated from a suitable source gas and implanted into the emitter layer 14 with selected implantation conditions using an ion implantation tool. The implantation conditions (e.g., ion species, dose, kinetic energy) may be selected to tune the characteristics of the amorphized layer 16. For example, the depth, d1, at which the interface 17 is located relative to the top surface 13 of the emitter layer 14 can be controlled through selection of implantation conditions during the amorphization implant that controls the thickness of the amorphous layer 16. The amorphized layer 16 may be formed using chained implants (e.g., multiple discrete implantations of ions 18 performed at different kinetic energies). In an embodiment, the ions 18 may comprise an ion species selected from germanium (Ge), arsenic (Ar), or both. In an embodiment, the ions 18 may be implanted into the emitter layer 14 at an energy of 40 keV with a dose of $1 \times 10^{16}$ cm$^{-2}$.

Figure 3:
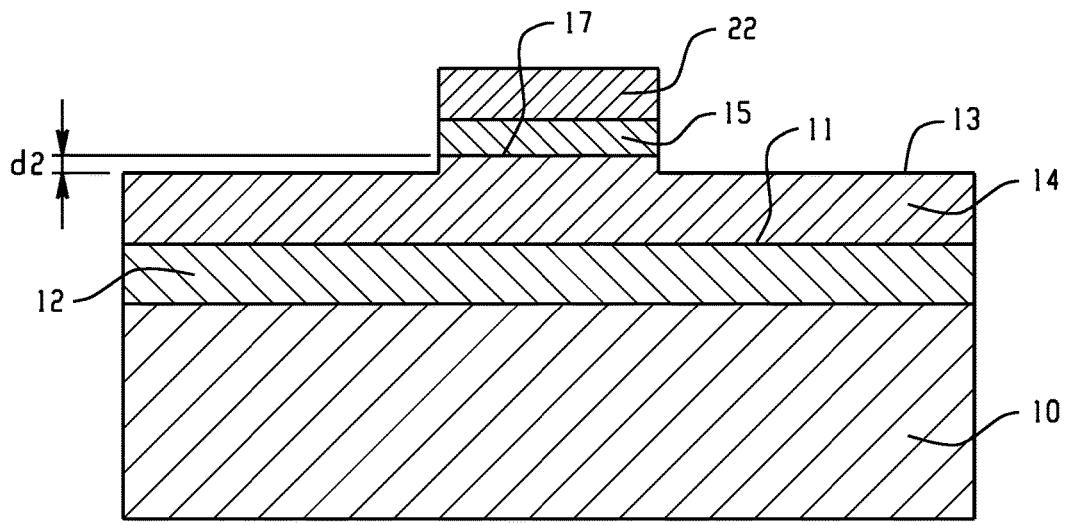

With reference to FIG. 3 in which like reference numerals refer to like features in FIG. 2 and at a subsequent fabrication stage, a cap layer 22 may be formed on the top surface 13 of the emitter layer 14 and patterned to define an etch mask. The cap layer 22 may be comprised of a dielectric material, such as silicon dioxide (SiO$_2$) or silicon nitride (Si$_3$N$_4$), or a different type of material, such as amorphous silicon. A mask layer (not shown) of photoresist may be applied on the top surface of the cap layer 22 and patterned with photolithography to mask a section of the cap layer 22. Unmasked sections of the cap layer 22 are removed with an etching process, such as reactive ion etching (RIE), to form a hardmask.

Sections of the amorphized layer 16 that are not masked by the patterned cap layer 22 are subsequently removed with an etching process, such as reactive ion etching (ME) with a masked section 15 of the amorphized layer 16 being preserved. The etching process etches completely through the amorphized layer 16 and into the emitter layer 14 to a shallow depth, d2, vertically below the interface 17 between the section 15 of the amorphized layer 16 and the emitter layer 14. As a result, the top surface 13 of the emitter layer 14 from which the amorphized layer 16 is removed becomes recessed relative to the interface 17. The cap layer 22 may be stripped after patterning is completed.

Figure 4:
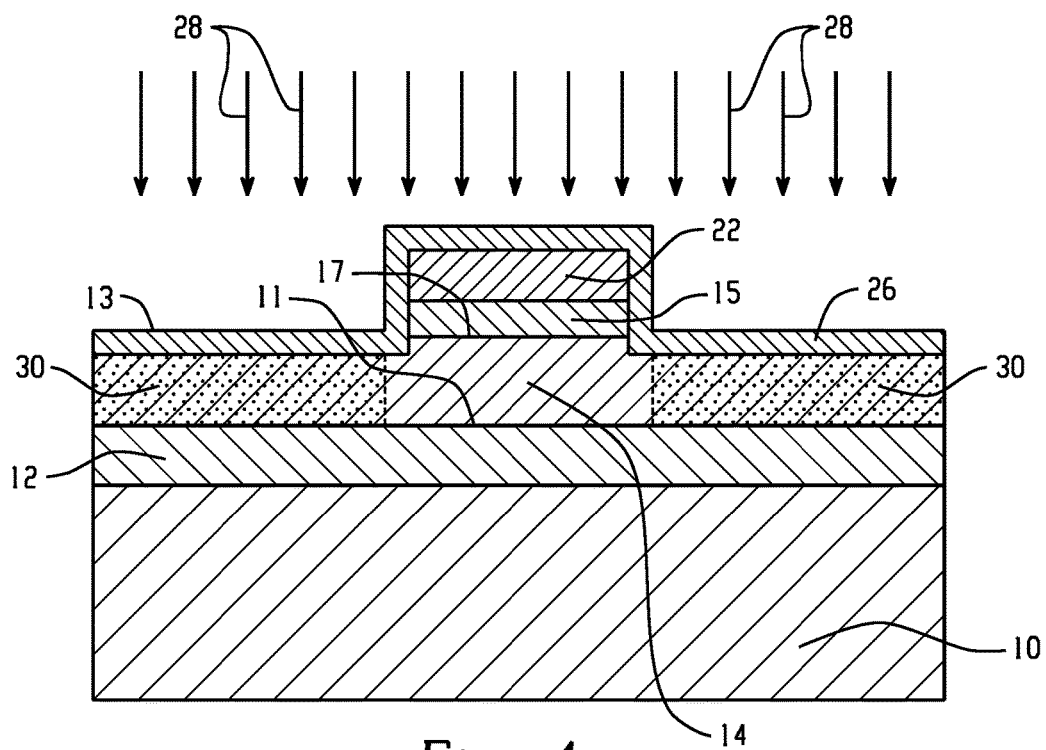

With reference to FIG. 4 in which like reference numerals refer to like features in FIG. 3 and at a subsequent fabrication stage of the processing method, a conformal layer 26 may be deposited on the top surface and sidewalls of the etched amorphized layer 16, as well as the top surface 13 of the emitter layer 14 adjacent to the etched amorphized layer 16. The conformal layer 26 may be composed of a dielectric material, such as silicon nitride (Si$_3$N$_4$), that is removable selective to the semiconductor material of the emitter layer 14.

Energetic ions, as indicated diagrammatically by the single-headed arrows 28, are introduced through the top surface 13 into the emitter layer 14 to form a doped region 30 peripheral to the section 15 of the amorphized layer 16 and beneath the top surface 13. In an embodiment, the ions 28 may deliver a p-type dopant selected from Group III of the Periodic Table (e.g., boron) effective to impart p-type conductivity to the semiconductor material of the doped region 30. The ions 28 may be generated from a suitable source gas and implanted with selected implantation conditions using an ion implantation tool. The implantation conditions (e.g., ion species, dose, kinetic energy), as well as the thickness of the conformal layer 26, may be selected to tune the characteristics of the doped region 30.

The combined thickness of the cap layer 22 and conformal layer 26 masks the section 15 of the amorphized layer 16 and the underlying section of the emitter layer 14 to prevent implantation by the ions 28. The section 15 of the amorphized layer 16 capped by the conformal layer 26 functions to self-align the formation of the doped region 30. In the representative embodiment, the doped region 30 is formed only in the emitter layer 14. In an alternative embodiment, the doped region 30 may extend past the interface between the emitter layer 14 and the base layer 12 to a depth into the base layer 12 through a modification to the implantation conditions.

Figure 5:
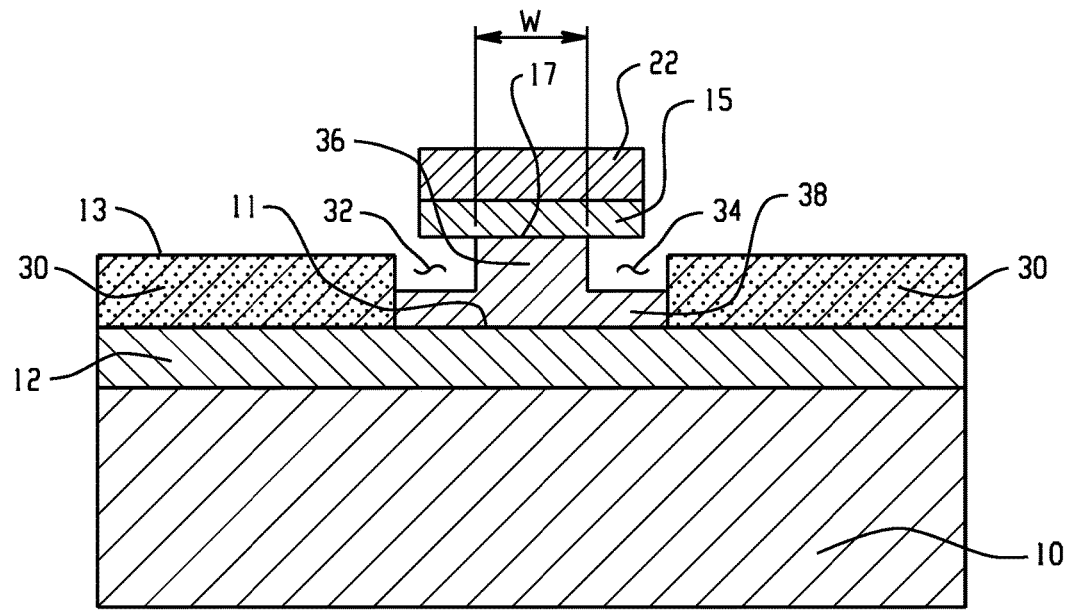

With reference to FIG. 5 in which like reference numerals refer to like features in FIG. 4 and at a subsequent fabrication stage, the conformal layer 26 is removed after the doped region 30 is formed in the base layer 12. The removal of the conformal layer 26 reveals the top surface 13 of the emitter layer 14 and the side edges of the section 15 of the amorphized layer 16.

After the conformal layer 26 is removed, cavities 32, 34 represented by lateral undercuts are formed. The cavities 32, 34 extend laterally beneath the section 15 of the amorphized layer 16 and vertically into the emitter layer 14 beneath the section 15 of the amorphized layer 16. The semiconductor material of the emitter layer 14 may be etched by a selective etching process, such as a wet chemical etching process. The selective etching process may remove the semiconductor material of emitter layer 14 selective to the semiconductor material of the amorphized layer 16 due to its crystal damage. The selective etching process may remove the semiconductor material of emitter layer 14 selective to the semiconductor material of the doped region 30, which has a dopant level that is significantly greater than the dopant level of the semiconductor material of the emitter layer 14. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. The semiconductor material of the material of the emitter layer 14 removed to form the cavities 32, 34 is not ion implanted when either the amorphized layer 16 or the doped region 30 are formed.

The profile of the cavities 32, 34 may be adjusted to have a specific shape, undercut angle, undercut distance (i.e., bias), etc. by selecting factors such as the chemistry, duration, etc. of the etching process. For example, the etching process may rely on wafer orientation and etching processes that exhibit different etch rates for different crystallographic directions (as specified by, for example, Miller indices) in a single-crystal semiconductor material to tailor the profile of the cavities 32, 34.

The ingress of the etchant is facilitated by the vertical recessing of the emitter layer 14 relative to the interface 17 between the section 15 of the amorphized layer 16 and the emitter layer 14. An opening to the emitter layer 14 beneath the section 15 of the amorphized layer 16 is created by the etching process initially in the semiconductor material of the emitter layer 14 located between the interface 17 and the recessed top surface 13 of the emitter layer 14 peripheral to the section 15 of the amorphized layer 16.

An emitter 36 and a link region 38 are shaped from the emitter layer 14 by the formation of the cavities 32, 34. The link region 38 is located vertically between the emitter 36 and the top surface 11 of the base layer 12. Cavity 32 may be interconnected with cavity 34 such that the emitter 36 is surrounded by the interconnected cavities 32, 34. The etching process forming the cavities 32, 34 is halted before penetrating completely through the emitter layer 14 so that the link region 38 is formed as a residual thickness of the emitter layer 14. The etching process forming the cavities 32, 34 is also controlled to impart a given width to the emitter 36. The dimensions of the cavities 32, 34 determine a width, W1, of the emitter 36 and a height of the emitter 36 between the top surface of the link region 38 and the bottom surface of the section 15 of the amorphized layer 16.

The cavities 32, 34 undercut an emitter extension defined by the section 15 of the amorphized layer 16, which is larger in dimensions (e.g., length and width) than the emitter 36. The enlarged section 15 of the amorphized layer 16 may be useful in permitting the dimensions of the emitter 36 to be reduced when the cavities 32, 34 are formed while retaining a larger tolerance for misalignment when forming a vertical contact to contact the emitter 36 from above. The top surface of the emitter 36, which is coextensive with the section 15, is located at the interface 17 with the section 15 of the amorphized layer 16.

Figure 6:
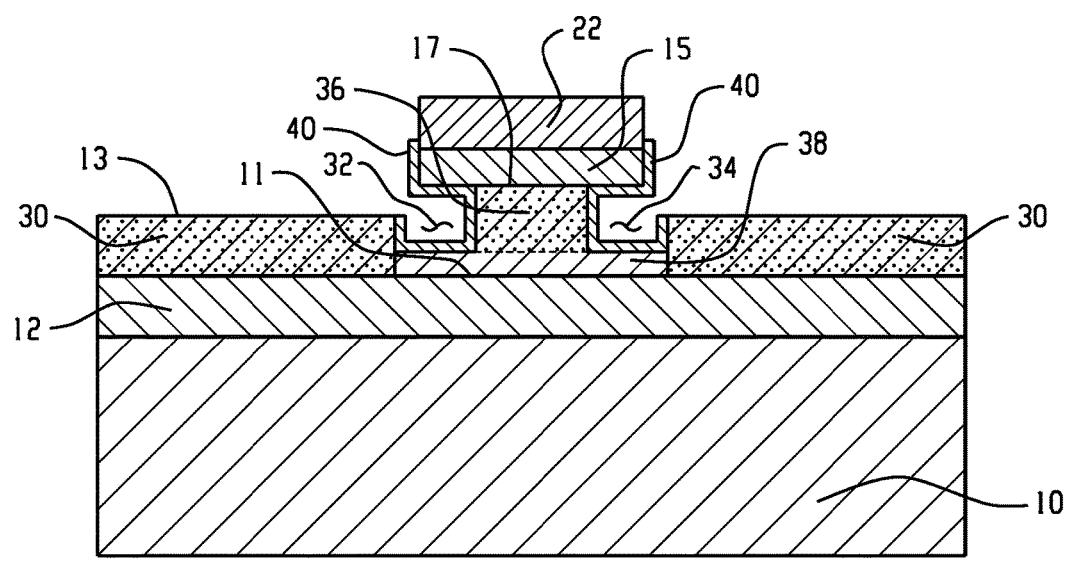

With reference to FIG. 6 in which like reference numerals refer to like features in FIG. 5 and at a subsequent fabrication stage, a passivation layer 40 is applied that covers the sidewalls of the section 15 of the amorphized layer 16 and the surfaces bordering the cavities 32, 34. The passivation layer 40 may be comprised of a dielectric material, such as a high temperature oxide (HTO) deposited using rapid thermal process (RTP) at temperatures of 500° C. or higher. In an alternative embodiment, the passivation layer 40 may be comprised of oxide formed by a different deposition process, by thermal oxidation of silicon (e.g., oxidation at high pressure with steam (HIPOX)), or by a combination of these techniques. In an alternative embodiment, a spacer (not shown) comprised of silicon nitride ($Si_3N_4$) may be formed that supports the section 15 of the amorphized layer 16 at its sidewalls.

A thermal process may be applied to drive the respective dopants from the doped region 30 and/or the amorphized layer 16 into the emitter 36, the link region 38, and/or the base layer 12 beneath the doped region 30. The thermal process may be a rapid thermal annealing (RTA) in which a high-temperature anneal is performed over a short time period.

Figure 7:
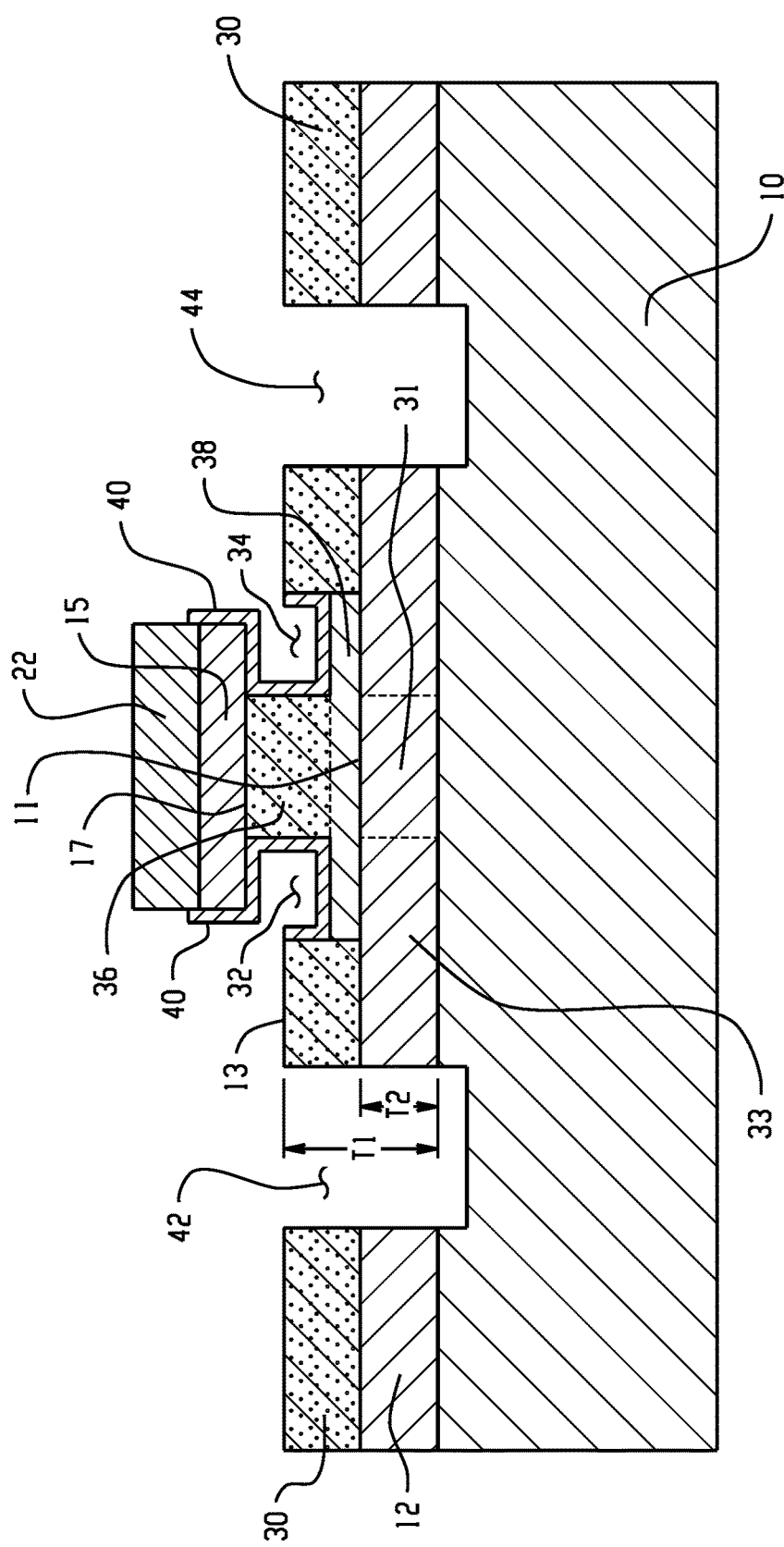

With reference to FIG. 7 in which like reference numerals refer to like features in FIG. 6 and at a subsequent fabrication stage, trenches 42, 44 are defined that extend from the top surface 13 of the emitter layer 14 completely through the doped region 30, completely through the base layer 12, and past the top surface of the substrate to a shallow depth into the substrate 10. A photoresist layer (not shown) is applied and lithographically patterned to define openings vertically aligned with the locations of the subsequently formed trenches 42, 44. The etching process used to form the trenches 42, 44 may comprise a reactive-ion etching (RIE) process. The etching process, which may be conducted in a single etching step or multiple steps, relies on one or more etch chemistries to etch the semiconductor materials of the doped region 30, the base layer 12, and the substrate 10, and may comprise one or more timed etches.

The doped region 30 and the base layer 12 are truncated by the formation of the trenches 42, 44, which may have vertical sidewalls bordered by the opposite edges of the doped region 30 and the base layer 12. The truncation of the doped region 30 and the base layer 12 defines the outer peripheral boundary of an extrinsic base 33 that includes the truncated doped region 30 and a section of the base layer 12 beneath the truncated doped region 30. All or part of the extrinsic base 33 may contain dopant from the doped region 30 and have a reduced electrical conductivity in the final device structure.

An intrinsic base 31 is defined from a section of the base layer 12 that is beneath the emitter 36 in an intrinsic device region and laterally surrounded by the extrinsic base 33. The emitter 36 is coupled with the intrinsic base 31 in the base layer 12 by an interface that may be located in the link region 38 and inside of an emitter window generally coinciding with the area of the emitter 36 at the transition from the emitter 36 to the link region 38. The extrinsic base 33 is used in the final device structure to contact the intrinsic base 31, and has a thickness, T1, that is greater than the thickness, T2, of the intrinsic base 31. The increased thickness of the extrinsic base 33 relative to the intrinsic base 31 arises from the formation of the doped region 30 and the selectivity of the etching process used to form the cavities 32, 34.

The top surface of the extrinsic base 33 is located at the former top surface 13 of the emitter layer 14, and the top surface of the intrinsic base 31 is located at the former top surface 11 of the base layer 12. The top surface 13 of the extrinsic base 33 is therefore arranged vertically between the top surface 17 of the emitter 36 and the top surface 11 of the intrinsic base 31.

Figure 8:
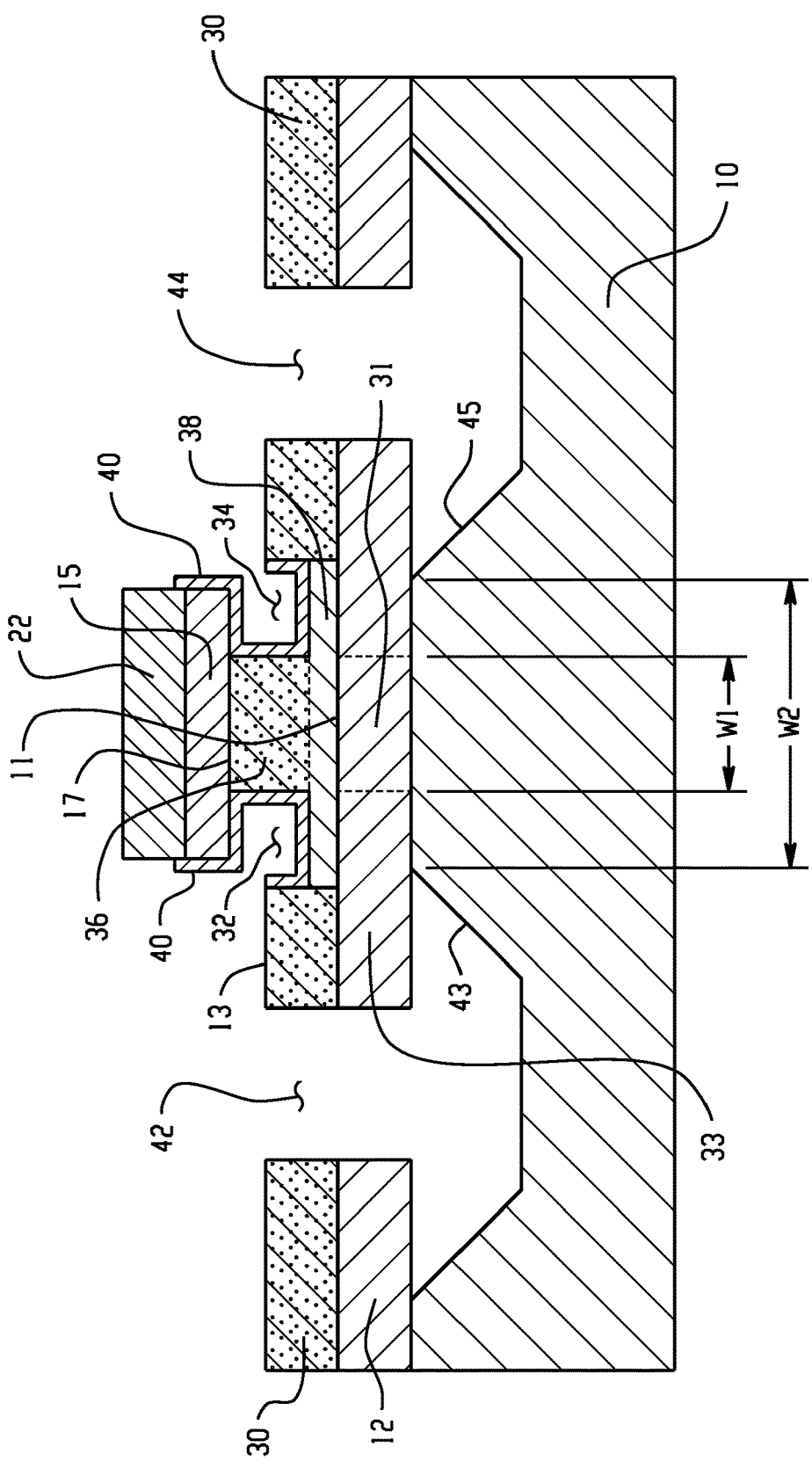

With reference to FIG. 8 in which like reference numerals refer to like features in FIG. 7 and at a subsequent fabrication stage, the shape of the portion of the trenches 42, 44 in the substrate 10 may be modified to undercut at least a portion of the extrinsic base 33. The semiconductor material of the substrate 10 may be etched by a wet chemical etching process to change the shape of the trenches 42, 44, and the profile of the trenches 42, 44 in the substrate 10 may be adjusted to have a specific shape, undercut angle, undercut distance (i.e., bias), etc. by selecting factors such as the chemistry, duration, etc. of the etching process. The wet chemical etching process may rely on wafer orientation and etching processes that exhibit different etch rates for different crystallographic directions (as specified by, for example, Miller indices) in a single-crystal semiconductor material to tailor the profile of the trenches 42, 44.

The wet chemical etching process removes the material of the substrate 10 selective to the semiconductor material of the base layer 12, which has a composition (e.g., a germanium content) that is different from the composition (e.g., no germanium content) of the semiconductor material of the substrate 10. The wet chemical etching process also removes the material of the substrate 10 selective to the semiconductor material of the doped region 30, which has a dopant level that is significantly greater than the dopant level of the semiconductor material of the substrate 10. A passivation layer (not shown) comprised of, a dielectric material, such as silicon dioxide ($SiO_2$), may be applied to the surfaces bordering the trenches 42, 44 in order to provide an etch mask during the wet chemical etching process.

A collector 46 is located in the substrate 10 laterally between a sidewall 43 that borders the trench 42 and a sidewall 45 that borders the trench 44. The collector 46 has a top surface 47 that is coextensive with the intrinsic base 31 and the extrinsic base 33 such that the respective thicknesses of the intrinsic base 31 and extrinsic base 33 can be measured relative to the top surface 47. The sidewalls 43, 45 of the collector 46 each intersect the top surface 47 of the collector 46 (and therefore the bottom surface of the extrinsic base 33) at a location beneath the extrinsic base 33.

The collector 46 is comprised of the semiconductor material of the substrate 10, and may be selectively implanted with an impurity to further enhance its electrical conductivity. In one embodiment, the collector 46 may comprise n-type semiconductor material and may optionally be implanted with an n-type dopant (e.g., arsenic (As) or phosphorus (P)) to enhance its electrical conductivity relative to the bulk of the substrate 10. The collector 46 has a width, W2, that can be evaluated at the intersection between the inclined sidewalls 43, 45 and the base layer 12. In the representative embodiment, the width of the collector 46 is greater than the width, W1, of the emitter 36. In alternative embodiments, the shape and dimensions of the cavities 32, 34 and the shape and dimensions of the trenches 42, 44 may be adjusted such that the width of the collector 46 is less than or equal to the width of the emitter 36. The width of the emitter extension defined by the section 15 of the amorphized layer 16 is greater than the width of the emitter 36 and, in the representative embodiment, is less than the width of the collector 46.

The extrinsic base 33, which is coupled with the intrinsic base 31, is positioned in a lateral arrangement with the intrinsic base 31 and also in a lateral arrangement with the emitter 36. All or part of the extrinsic base 33 is undercut by the inclined sidewalls 43, 45 to define sections (e.g., wings) of the extrinsic base 33. The increased thickness of the extrinsic base 33 relative to the intrinsic base 31 strengthens and stiffens these undercut sections of the extrinsic base 33 to compensate for the removal of the material of the substrate 10 when the shape of the trenches 42, 44 is modified to form the inclined sidewalls 43, 45.

Figure 9:
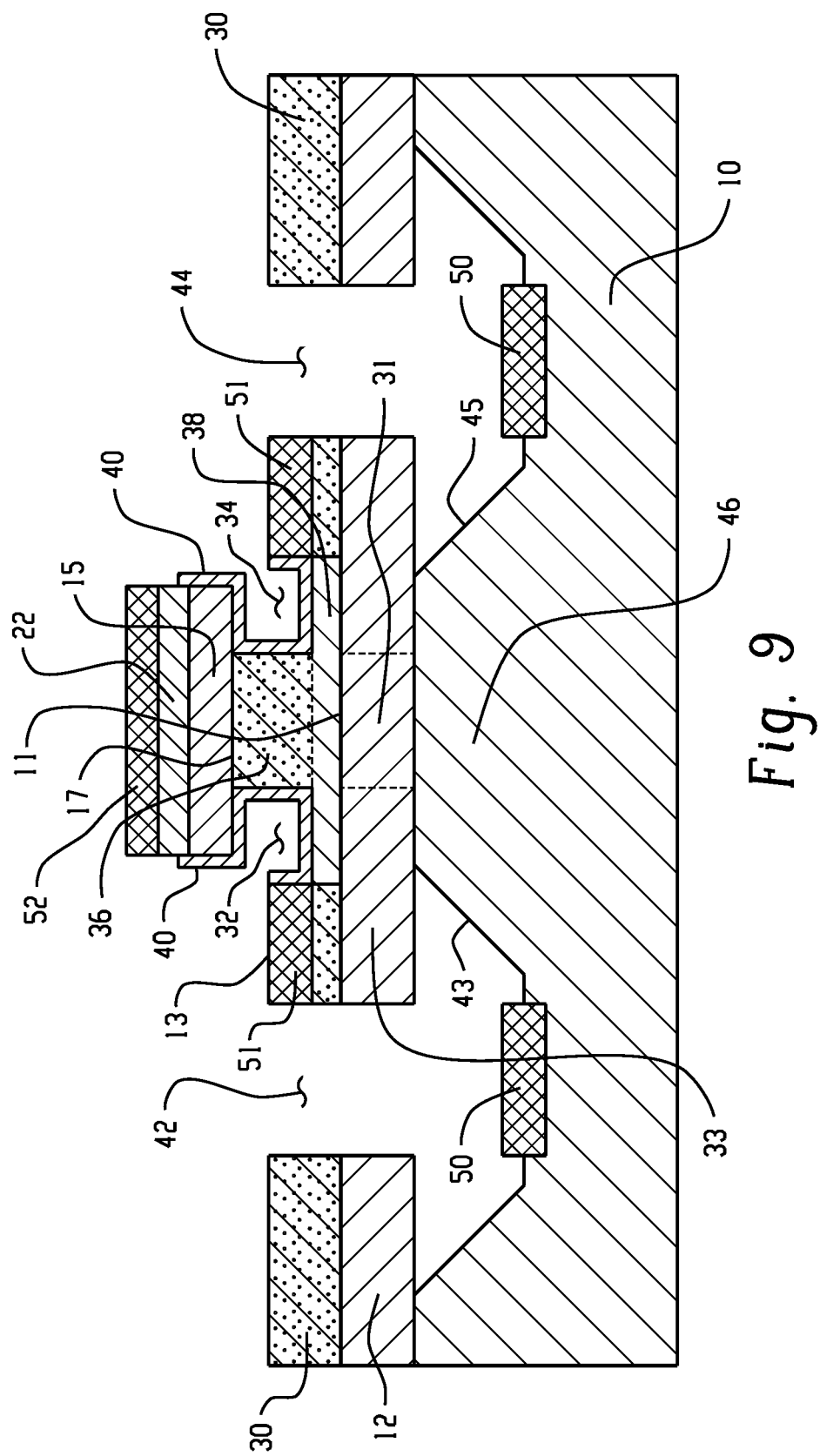

With reference to FIG. 9 in which like reference numerals refer to like features in FIG. 8 and at a subsequent fabrication stage, the cap layer 22 is removed from the top surface of the amorphized layer 16. Sections 50 of a silicide layer are formed at the substrate 10 inside of the trenches 42, 44 and may be subsequently used in the process flow for landing one or more contacts to contact the collector 46. Sections 51 of the silicide layer are formed at the top surface of the extrinsic base 33 and may be used to land one or more contacts to contact the intrinsic base 31. A section 52 of the silicide layer consumes at least a portion of the section 15 of amorphized layer 16 and forms at the top surface of the emitter extension located above the emitter 36 for use in landing one or more contacts to contact the emitter 36.

The sections 50-52 of the silicide layer may be simultaneously formed by a silicidation process that involves one or more annealing steps to form a silicide phase by reacting a layer of silicide-forming metal and the semiconductor material contacting the silicide-forming metal. The layer of a silicide-forming metal is deposited by, for example, a CVD process or a physical vapor deposition (PVD) process. A candidate refractory metal for the silicide-forming metal is cobalt (Co). A capping layer (not shown) comprised of a metal nitride, such as sputter-deposited titanium nitride (TiN), may be applied to cap the silicide-forming metal.

An initial annealing step of the silicidation process may form a metal-rich silicide that consumes the silicide-forming metal and then form silicides of lower metal content that grow by consuming the metal-rich silicides. For example, the initial annealing step may be conducted by heating the silicide-forming metal utilizing rapid thermal annealing (RTA) at an annealing temperature, which may be contingent on the type of refractory metal, of about 400° C. to about 900° C. Following the initial annealing step, any non-converted silicide-forming metal and the optional capping layer may be removed with, for example, one or more wet chemical etches. The sections 50-52 of silicide may then be subjected to an additional annealing step to form a lower-resistance silicide phase. The annealing temperature of the additional annealing step may be greater than the annealing temperature of the initial annealing step.

The resulting device structure 60 is a heterojunction bipolar transistor characterized by a vertical architecture that includes the emitter 36, the collector 46, and the intrinsic base 31 located vertically between the emitter 36 and collector 46. The intrinsic base 31 adjoins the collector 46 along a p-n junction. The emitter 36 adjoins the intrinsic base 31 along another p-n junction. The intrinsic base 31 has a vertical arrangement between the emitter 36 and the top surface 47 of the collector 46. The device structure 60 can be divided into an intrinsic device region coinciding with the portions of the collector 46, the emitter 36, and the intrinsic base 31 that participate in the p-n junctions, and an extrinsic device region outside of the intrinsic device region.

Middle-of-line (MOL) processing and back-end-of-line (BEOL) processing follow, which includes formation of contacts and wiring for a MOL local interconnect structure, and formation of dielectric layers, via plugs, and wiring for a BEOL interconnect structure coupled by the local interconnect structure with the device structure 60.

The dimensions of the emitter 36 may be chosen independent of the dimensions of the collector 46. In particular, the emitter 36 has dimensions that are determined by a lateral undercut etch. The collector 46 also has dimensions that are determined by a separate and distinct lateral undercut etch from the lateral undercut etch forming the emitter 36. The emitter 36 and the intrinsic base 31 are self-aligned by the selective etching processes used in the formation of the emitter 36.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for forming a heterojunction bipolar transistor, the method comprising:
   epitaxially growing a first semiconductor layer on a top surface of a substrate;
   epitaxially growing a second semiconductor layer on the first semiconductor layer;
   amorphizing a first section of the second semiconductor layer;
   doping a second section of the second semiconductor layer that has a lateral arrangement relative to the first section of the second semiconductor layer; and
   etching the second semiconductor layer beneath the first section and selective to the first section and the second section of the second semiconductor layer to form an emitter beneath the first section and a first cavity that laterally separates the second section from the emitter.

2. The method of claim 1 wherein the emitter is formed by vertically and laterally etching the second semiconductor layer beneath the first section of the second semiconductor layer, and the first cavity extends partially through a thickness of the second semiconductor layer in a vertical direction.

3. The method of claim 1 wherein the first section of the second semiconductor layer is amorphized by ion implantation, and the second section of the second semiconductor layer is doped by ion implantation.

4. The method of claim 1 wherein the second section of the second semiconductor layer provides a first portion of an extrinsic base and a section of the first semiconductor layer vertically between the top surface of the substrate and the second section of the second semiconductor layer provides a second portion of the extrinsic base, and the extrinsic base is laterally arranged relative to an intrinsic base located in the first semiconductor layer between the emitter and the top surface of the substrate.

5. The method of claim 4 wherein the emitter has a first width, the first section of the second semiconductor layer defines an emitter extension having a second width that is greater than the first width of the emitter, the emitter is vertically arranged between the emitter extension and the top surface of the intrinsic base, and the top surface of the extrinsic base is vertically arranged between the intrinsic base and the emitter extension.

6. The method of claim 4 wherein the intrinsic base has a top surface, and the extrinsic base has a top surface that projects above the top surface of the intrinsic base.

7. The method of claim 4 wherein the intrinsic base has a first thickness equal to a thickness of the first semiconductor layer, and the extrinsic base has a second thickness that is greater than the first thickness.

8. The method of claim 7 wherein the first thickness of the intrinsic base is equal to a thickness of the first semiconductor layer.

9. The method of claim 4 further comprising:
   forming a second cavity in the substrate to define a collector bounded by a first sidewall that is inclined relative to the top surface of the substrate and that extends laterally beneath the extrinsic base to undercut the extrinsic base.

10. The method of claim 9 wherein the first sidewall is inclined inwardly toward the intrinsic base, the collector has a second sidewall that is inclined inwardly toward the intrinsic base, the collector has a first width between the first sidewall and the second sidewall, and the emitter has a second width that is less than the first width of the collector.

11. The method of claim 9 wherein the second cavity is formed after the emitter and the first cavity are formed.

* * * * *